(12) United States Patent
Ueda

(10) Patent No.: US 7,376,036 B2
(45) Date of Patent: May 20, 2008

(54) SEMICONDUCTOR DEVICE INCLUDING FUSE AND METHOD FOR TESTING THE SAME CAPABLE OF SUPPRESSING ERRONEOUS DETERMINATION

(75) Inventor: Takehiro Ueda, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 73 days.

(21) Appl. No.: 11/350,112

(22) Filed: Feb. 9, 2006

(65) Prior Publication Data

US 2006/0200717 A1 Sep. 7, 2006

(30) Foreign Application Priority Data

Feb. 9, 2005 (JP) ............... 2005-033002

(51) Int. Cl.
*G11C 7/00* (2006.01)

(52) U.S. Cl. ............... 365/225.7; 365/201; 365/96; 365/100

(58) Field of Classification Search ............. 365/225.7, 365/201, 96, 100; 327/334, 525–526
See application file for complete search history.

(56) References Cited

U.S. PATENT DOCUMENTS

| 6,781,900 B2 * | 8/2004 | Furutani et al. ............ 365/201 |
| 7,030,641 B1 * | 4/2006 | Tang et al. ................. 365/201 |
| 7,054,180 B2 * | 5/2006 | Schamberger et al. ........ 365/96 |
| 7,136,322 B2 * | 11/2006 | Brennan et al. ......... 365/225.7 |

FOREIGN PATENT DOCUMENTS

JP 06-140510 5/1994

* cited by examiner

*Primary Examiner*—David Lam
(74) *Attorney, Agent, or Firm*—Young & Thompson

(57) ABSTRACT

In a method for testing whether or not a fuse on a semiconductor substrate is disconnected, a first test operation is performed upon the fuse by determining whether or not a resistance value of the fuse is larger than a first threshold resistance value. Then, a second test operation is performed upon the fuse by determining whether or not a resistance value of the fuse is larger than a second threshold resistance value smaller than the first threshold resistance value.

17 Claims, 10 Drawing Sheets

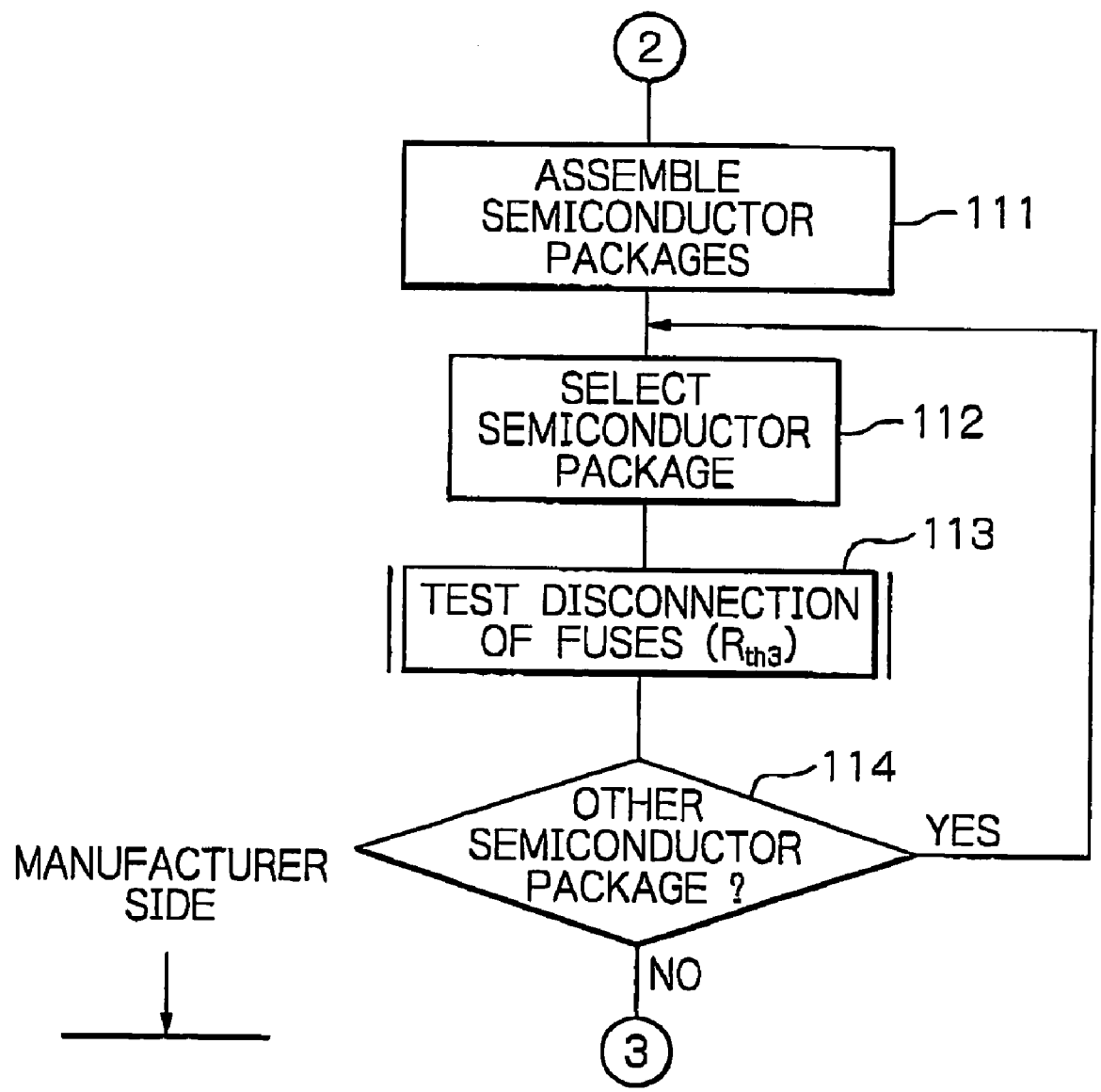

SEMICONDUCTOR DEVICE INCLUDING FUSE AND METHOD FOR TESTING THE SAME CAPABLE OF SUPPRESSING ERRONEOUS DETERMINATION

BACKGROUND OF THE INVENTION

1. Field of the Invention

The present invention relates to a semiconductor device including a fuse, and more particularly, to a method for testing whether or not the fuse is disconnected.

2. Description of the Related Art

Fuses may be incorporated into semiconductor devices. For example, in a semiconductor memory device incorporating normal memory cells and redundancy memory cells, not only a normal decoder for selecting the normal memory cells but also a redundancy decoder for selecting the redundancy memory cells are provided. That is, if a defective memory cell is found in the normal memory cells, an address of such a defective memory cell is written into the redundancy decoder. As a result, when this address is received by the redundancy decoder, the redundancy decoder deactivates the normal decoder, and in its place, selects the redundancy memory cell, to thereby replace the defective memory cell with the redundancy memory cell. Thus, the problem of the defective memory cell is alleviated.

The redundancy decoder Is usually comprised of a multi-bit fuse-type programmable read-only memory (PROM). Therefore, writing operation of the above-mentioned address into the redundancy decoder is carried out by laser trimming of fuses or by supplying a blowing current thereto (see: JP-6-140510-A).

After a fuse is disconnected by the above-mentioned writing operation, it is necessary to ensure that the fuse is completely disconnected.

In a prior art method for testing whether or not a fuse is disconnected, it is determined whether or not a voltage at one node of the fuse upon application of a predetermined voltage between the nodes thereof is larger (or smaller) than a threshold voltage. In other words, it is determined whether or not the resistance value of the fuse is larger than a threshold resistance value (see: JP-6-140510-A).

SUMMARY OF THE INVENTION

It has now been discovered that the above-described prior art testing method, however, if a plurality of testing operations are repeated at various steps, it would be erroneously determined that the fuse is not disconnected even if the fuse is disconnected. As a result, such a semiconductor memory device is scrapped.

That is, every time a voltage is applied to a fuse, the resistance value of the fuse would be gradually decreased due to the electromigration phenomenon. As a result, if the threshold resistance value is set to be too large, the resistance value of the fuse upon application of repeated voltages would finally become smaller than the threshold resistance voltage.

According to the present invention, in a method for testing whether or not a fuse on a semiconductor substrate is disconnected, a first test operation is performed upon the fuse by determining whether or not a resistance value of the fuse is larger than a first threshold resistance value. Then, a second test operation is performed upon the fuse by determining whether or not a resistance value of the fuse is larger than a second threshold resistance value smaller than the first threshold resistance value.

Also, in a semiconductor device including first and second nodes, a fuse and a resistive element are connected in series between the first and second nodes, and a comparator is connected to a third node between the fuse and the resistive element and is adapted to compare a voltage at the third node with a threshold voltage, so that different differences in potential are applied between the first and second nodes to determine whether or not the fuse is disconnected.

Further, a semiconductor device is constructed by a pad, first and second sense lines, a fuse connected to the pad, a first switch connected between the fuse and the first sense line, a plurality of resistors having different threshold resistance values connected to the pad, a second switch connected between the resistors and the second sense line and adapted to select one of the resistors, and a sense amplifier connected to the first and second sense lines and adapted to compare a current flowing through the fuse connected to the first sense line by the first switch with a current flowing through one of the resistors selected by the second switch.

BRIEF DESCRIPTION OF THE DRAWINGS

The present invention will be more clearly understood from the description set forth below, with reference to the accompanying drawings, wherein:

FIGS. 1A, 1B, 1C and 1D are flowcharts for explaining an embodiment of the method for manufacturing (testing) a semiconductor device according to the present invention;

FIG. 6 is a circuit diagram of a fourth example of the semiconductor memory device used in FIGS. 1A, 1B, 1C and 1D.

DESCRIPTION OF THE PREFERRED EMBODIMENT

Figure 1A:
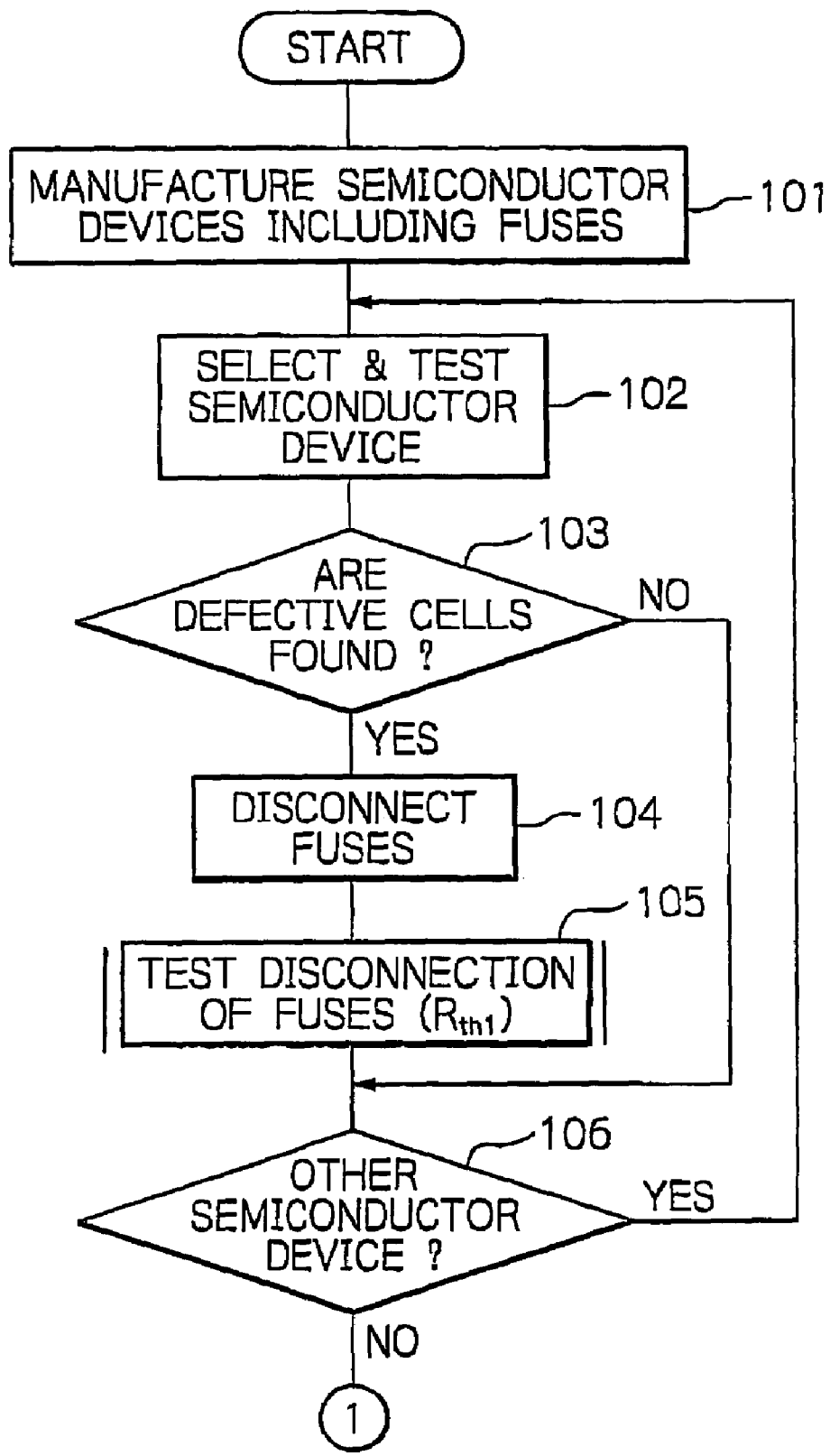
Figure 1B:
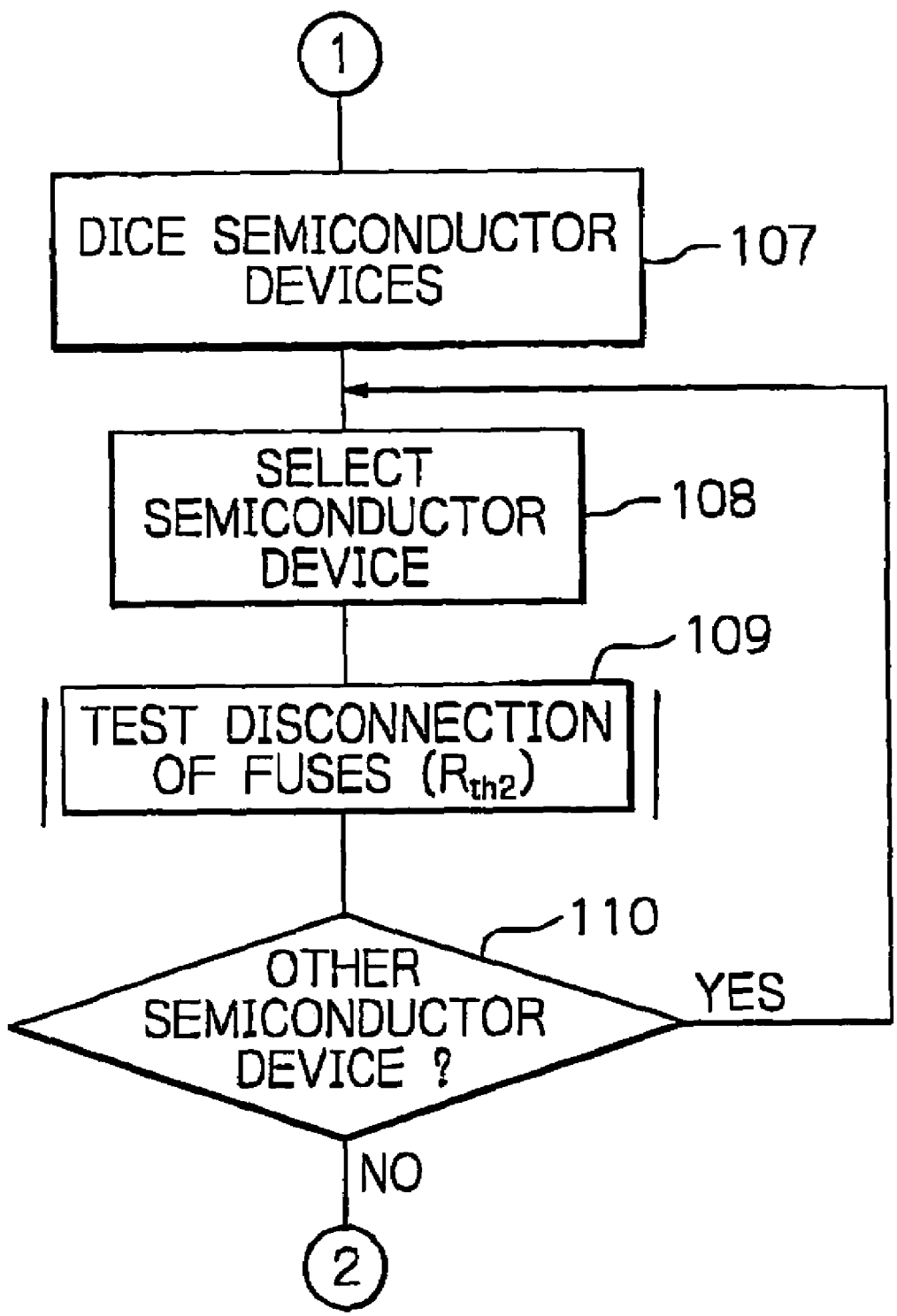
Figure 1D:
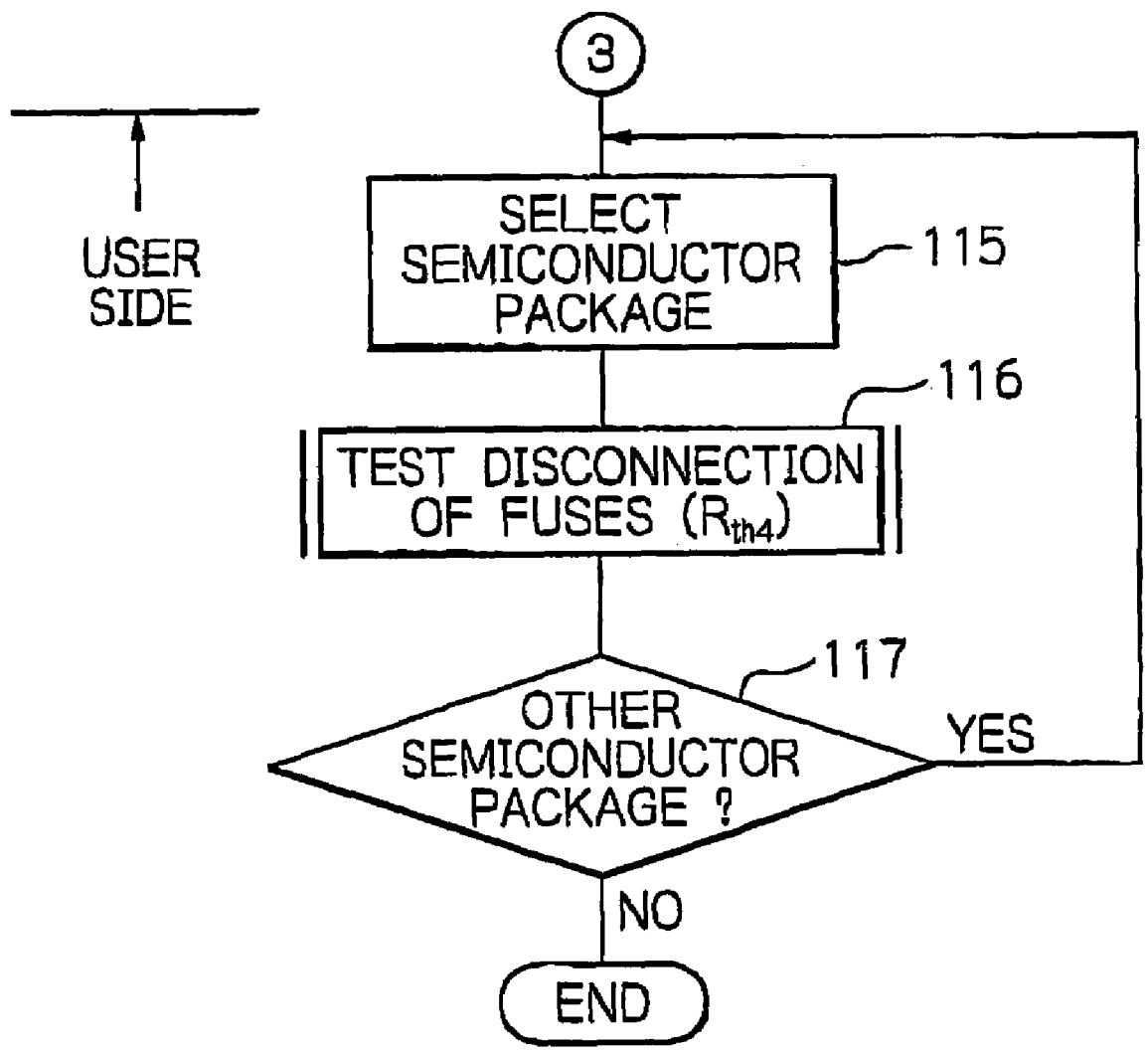

An embodiment of the method for manufacturing (testing) a semiconductor device according to the present invention will now be explained with reference to FIGS. 1A, 1B, 1C and 1D.

First, at step 101, a plurality of semiconductor devices (chips) are formed in a semiconductor wafer by using various semiconductor manufacturing processes such as oxidizing processes, deposition processes, photolithography and etching processes and so on. As a result, transistor elements, passive elements and interconnections along with fuses for redundancy circuits are formed in each of the semiconductor devices.

Next, at step 102, a so-called wafer test is carried out. That is, one semiconductor device (chip) is selected so that a test is performed upon the selected semiconductor device by applying test voltages thereto through test probes. Note that a plurality of semiconductor devices (chips) can be selected so that the above-mentioned test can be simultaneously performed upon the plurality of semiconductor devices (chips).

Next, at step 103, it is determined whether or not one or more defective cells are found by the test at step 102. Only when such defective cells are found, does the control proceed to steps 104 and 105. Otherwise, the control proceeds directly to step 106.

At step 104, fuses corresponding to the defective cells are disconnected by a laser trimming method or a current supplying method. Then, the control proceeds to step 105.

At step 105, it is determined whether or not the fuses disconnected at step 104 are actually disconnected by determining whether or not $$R_f > R_{th1}$$

where $R_f$ is a resistance value of a disconnected fuse; and $R_{th1}$ is a threshold resistance value. In this case, since no consideration is given to the electromigration phenomenon of the disconnected fuse, the threshold resistance value $R_{th1}$ is usually set to be relatively large.

At step 105, if $R_f \leq R_{th1}$, a disconnecting operation by the laser trimming method or the current supplying method can be again performed upon the corresponding fuse, which is in this case again subjected to a disconnection test. Otherwise, the semiconductor device (chip) including this fuse can be scrapped. At worst, the entire semiconductor wafer can be scrapped.

Step 106 repeats the control at steps 102 through 105 for all the semiconductor devices (chips) in the semiconductor wafer.

Next, at step 107, the semiconductor wafer is diced into the semiconductor devices (chips) which are separated from each other.

Next, at step 108, one semiconductor device (chip) having disconnected fuses is selected.

Next, at step 109, it is determined whether or not the fuses disconnected at step 104 are actually disconnected by determining whether or not $$R_f > R_{th2}$$

where $R_f$ is a resistance value of a disconnected fuse; and $R_{th2}$ is a threshold resistance value, In this case, since consideration is given to the past electromigration phenomenon of the disconnected fuse, the threshold resistance value $R_{th2}$ is usually set to be smaller than $R_{th1}$.

Even at step 109, if $R_f \leq R_{th2}$, a disconnecting operation by the laser trimming method or the current supplying method can be again performed upon the corresponding fuse, which is in this case again subjected to a disconnection test. Otherwise, the semiconductor device (chip) including this fuse can be scrapped.

Step 110 repeats the control at steps 108 and 109 for all the semiconductor devices (chips) including disconnected fuses.

Next, at step 111, the semiconductor devices are assembled into semiconductor packages. That is, the semiconductor devices (chips) are subjected to necessary external connections provided by a wire bonding method or a flip-chip connection method, and are then sealed by resin.

Next, at step 112, one semiconductor package having disconnected fuses is selected.

Next at step 113, it is determined whether or not the fuses disconnected at step 104 are actually disconnected by determining whether or not $$R_f > R_{th3}$$

where $R_f$ is a resistance value of a disconnected fuse; and $R_{th3}$ is a threshold resistance value. In this case, since consideration is given to the past electromigration phenomenon of the disconnected fuse, the threshold resistance value $R_{th3}$ is usually set to be smaller than or equal to $R_{th2}$.

Even at step 113, if $R_f \leq R_{th3}$, a disconnecting operation by the laser trimming method or the current supplying method can be again performed upon the corresponding fuse, which is in this case again subjected to a disconnection test. Otherwise, the semiconductor package including this fuse can be scrapped.

Step 114 repeats the control at steps 112 and 113 for all the semiconductor packages including disconnected fuses.

After step 114, the semiconductor packages, which have passed the test at step 114, may be shipped to users who may carry out the control at steps 115, 116 and 117 as occasion demands.

At step 115, one semiconductor package having disconnected fuses is selected.

Next, at step 116, it is determined whether or not the fuses disconnected at step 104 are actually disconnected by determining whether or not $$R_f > R_{th4}$$

where $R_f$ is a resistance value of a disconnected fuse; and $R_{th4}$ is a threshold resistance value. In this case, since consideration is given to the past electromigration phenomenon of the disconnected fuse, the threshold resistance value $R_{th4}$ is usually set to be smaller than or equal to $R_{th3}$.

Even at step 116, if $R_f \leq R_{th4}$, a disconnecting operation by the laser trimming method or the current supplying method can be again performed upon the corresponding fuse, which is in this case again subjected to a disconnection test. Otherwise, the semiconductor package including this fuse can be scrapped.

Step 117 repeats the control at steps 115 and 116 for all the semiconductor packages including disconnected fuses required by the users.

Thus, the above-mentioned threshold resistance values $R_{th1}$, $R_{th2}$, $R_{th3}$ and $R_{th4}$ satisfy the following formula:

$$R_{th1} > R_{th2} \geq R_{th3} \geq R_{th4} > R_{min}$$

where $R_{min}$ is a minimum resistance of a disconnected fuse, so that the semiconductor memory device can be normally operated.

Figure 2:
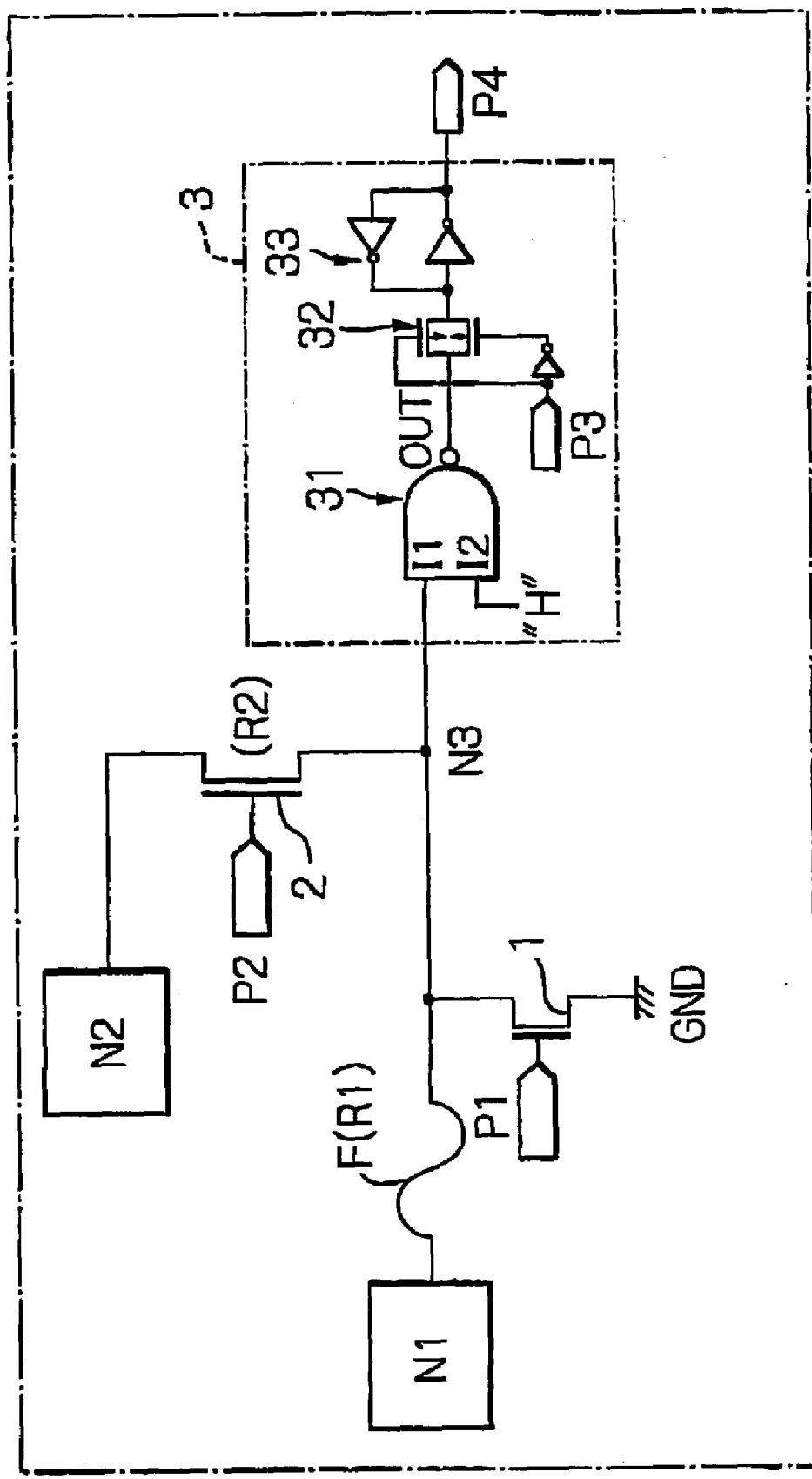
FIG. 2 is a circuit diagram of a first example of the semiconductor memory device used in FIGS. 1A, 1B, 1C and 1D.

In FIG. 2, which illustrates a first example of the semiconductor memory device used in FIGS. 1A, 1B, 1C and 1D, only one fuse section of a redundancy decoder thereof manufactured at step 101 of FIG. 1A is illustrated. That is, a fuse F and a switch 1 formed by an N-channel MOS transistor for blowing the fuse F are connected in series between a node N1 and the ground GND. In this case, an internal voltage generated by a voltage generating circuit (not shown) or an external voltage supplied from a pad (not shown) is applied to the node N1.

When a voltage is externally applied to a pad P1 of the transistor 1 under the condition that a blowing voltage is applied to the node N1, the fuse F is disconnected.

Also, a switch 2 formed by an N-channel MOS transistor is connected between a node N2 and a node N3 which is located between the fuse F and the transistor 1. In this case, when a voltage is externally applied to a pad P2 of the transistor 2, the transistor 2 is turned ON so that the transistor 2 serves as a resistive element having an ON resistance thereof.

Further, a comparator 3 is connected to the node N3. The comparator 3 is constructed by a NAND circuit 31, a transfer gate 32 formed by a P-channel MOS transistor and an N-channel MOS transistor, and a latch circuit 33 formed by two ring-connected inverters. The NAND circuit 31 has an input I1 connected to the node N3 and an input I2 for receiving an internally- or externally-generated high voltage. Usually, since the input I1 has a substantially definite threshold voltage $V_{th}$ determined by an input transistor, an output voltage OUT depends upon whether or not the voltage at the node N3 is higher than $V_{th}$. That is, if $V_{N3} > V_{th}$ where $V_{N3}$ is a voltage at the node N3, the output voltage OUT is low, while, if $V_{N3} \leq V_{th}$, the output voltage OUT is high. When an externally-supplied voltage at a pad P3 of the transfer gate 32 is high, the output voltage OUT is latched by the latch circuit 33 which generates an output signal at a pad P4.

Figure 3:
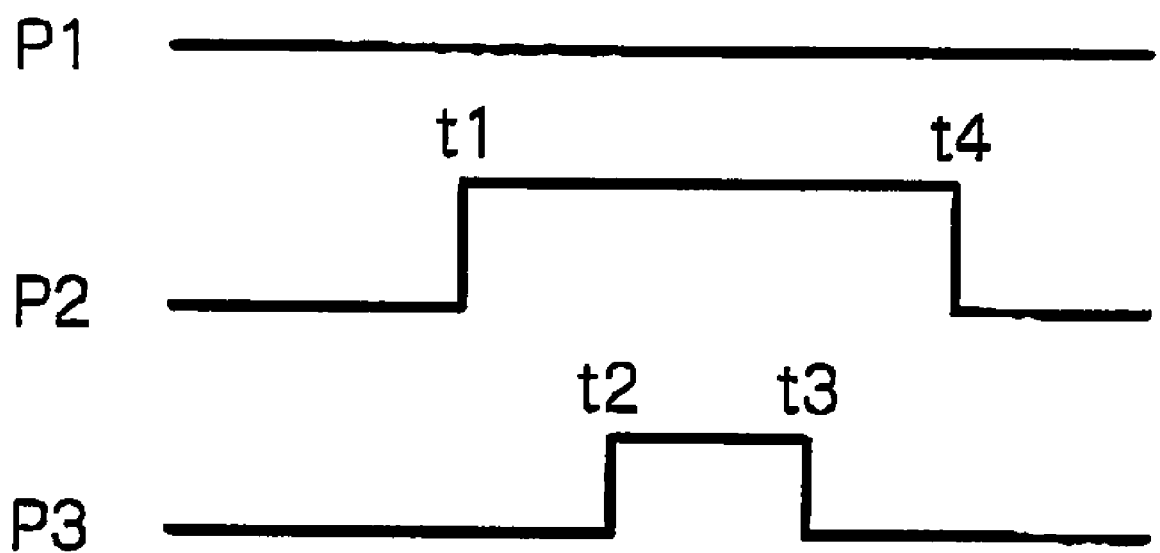
FIG. 3 is a timing diagram explaining the operation of the device of FIG. 2.

Examples of determination of two different threshold resistance values $R_{th1}$ and $R_{th2}$ are explained below. In any examples, as shown in FIG. 3, the voltage at the pad P1 is low so that the transistor 1 is turned OFF. Also, while the voltage at the pad P2 is high from time t1 to time t4 to turn ON the transistor 2, the voltage at the pad P3 is made high from time t2 to time t3. Therefore, even after time t4, the comparison result of the comparator 3 is maintained at the pad P4.

In a first determining example, the threshold resistance value $R_{th1}$ is realized by applying $-\alpha(\alpha>0)$ and $V_{CC}$ to the nodes N1 and N2, respectively, i.e., by applying a difference $V_{CC}+\alpha$ in potential between the nodes N1 and N2. That is, $$V_{N3} = V_{CC} \cdot R1/(R1+R2) - \alpha \cdot R2/(R1+R2) \tag{1}$$

where R1 is a resistance value of the fuse F; and R2 is a resistance value of the turned-ON transistor 2. In this case, in order to realize that the fuse F is disconnected, i.e., that $R1 > R_{th1}$, $$V_{N3} > V_{th} \tag{2}$$

Therefore, from the formulae (1) and (2), $$R1 > R_{th1} = R2 \cdot (V_{th}+\alpha)/(V_{CC}-V_{th}) \tag{3}$$

On the other hand, the threshold resistance value $R_{th2}$ is realized by applying 0V and $V_{CC}$ to the nodes N1 and N2, respectively, i.e., by applying a difference $V_{CC}$ in potential between the nodes N1 and N2. That is, $$V_{N3} = V_{CC} \cdot R1/(R1+R2) \tag{4}$$

In this case, in order to realize that the fuse F is disconnected, i.e., that $R1 > R_{th2}$, $$V_{N3} > V_{th} \tag{5}$$

Therefore, from the formulae (4) and (5), $$R1 > R_{th2} = R2 \cdot V_{th}/(V_{CC}-V_{th}) \tag{6}$$

From the formulae (3) and (6), the threshold resistance value $V_{th1}$ is larger than the threshold resistance value $V_{th2}$ by $\alpha \cdot R2/(V_{CC}-V_{th})$.

In the first determining example, a voltage of $-\alpha$ or 0V is externally applied to the node N1, while a voltage of $V_{CC}$ is internally or externally applied to the node N2.

In a second determining example, the threshold resistance value $R_{th1}$ is realized by applying 0V and $V_{CC}-\alpha$ ($\alpha>0$ and $V_{CC}>\alpha$) to the nodes N1 and N2, respectively, i.e., by applying a difference $V_{CC}-\alpha$ in potential between the nodes N1 and N2. That is, $$V_{N3} = (V_{CC}-\alpha) \cdot R1/(R1+R2) \tag{7}$$

In this case, in order to realize that the fuse F is disconnected, i.e., that $R1 > R_{th1}$, $$V_{N3} > V_{th} \tag{8}$$

Therefore, from the formulae (7) and (8), $$R1 > R_{th1} = R2 \cdot V_{th}/(V_{CC}-V_{th}-\alpha) \tag{9}$$

On the other hand, the threshold resistance value $R_{th2}$ is realized by applying 0V and $V_{CC}$ to the nodes N1 and N2, respectively, i.e., by applying a difference $V_{CC}$ in potential between the nodes N1 and N2. That is, $$V_{N3} = V_{CC} \cdot R1/(R1+R2) \tag{10}$$

In this case, in order to realize that the fuse F is disconnected, i.e., that $R1 > R_{th2}$, $$V_{N3} > V_{th} \tag{11}$$

Therefore, from the formulae (10) and (11), $$R1 > R_{th2} = R2 \cdot V_{th}/(V_{CC}-V_{th}) \tag{12}$$

From the formulae (9) and (12), the threshold resistance value $V_{th1}$ is larger than the threshold resistance value $V_{th2}$ by $\alpha \cdot R2 \cdot V_{th}/\{(V_{CC}-V_{th}) \cdot (V_{CC}-V_{th}-\alpha)\}$.

In the second determining example, a voltage of 0V is internally or externally applied to the node N1, while a voltage of $V_{CC-\alpha\ or\ VCC}$ is externally applied to the node N2. Also in this case, since 0V is applied to the node N1, the pad P1 can serve as the node N1.

In a third determining example, the threshold resistance value $R_{th1}$ is realized by applying $V_{CC}$ and 0V to the nodes N1 and N2, respectively, i.e., by applying a difference $V_{CC}$ in potential between the nodes N1 and N2. That is, $$V_{N3} = V_{CC} \cdot R2/(R1+R2) \tag{13}$$

In this case, in order to realize that the fuse F is disconnected, i.e., that $R1 > R_{th1}$, $$V_{N3} > V_{th} \tag{14}$$

Therefore, from the formulae (13) and (14), $$R1 > R_{th1} = R2 \cdot (V_{CC}-V_{th})/V_{th} \tag{15}$$

On the other hand, the threshold resistance value $R_{th2}$ is realized by applying $V_{CC}$ and $-\alpha$ ($\alpha>0$) to the nodes N1 and N2, respectively, i.e., by applying a difference $V_{CC}-\alpha$ in potential between the nodes N1 and N2. That is, $$V_{N3} = V_{CC} \cdot R2/(R1+R2) - \alpha \cdot R1/(R1+R2) \tag{16}$$

In this case, in order to realize that the fuse F is disconnected, i.e., that $R1 > R_{th2}$, $$V_{N3} > V_{th} \tag{17}$$

Therefore, from the formulae (16) and (17), $$R1 > R_{th2} = R2 \cdot (V_{CC}-V_{th})/(V_{th}+\alpha) \tag{18}$$

From the formulae (15) and (18), the threshold resistance value $V_{th1}$ is larger than the threshold resistance value $V_{th2}$ by $\alpha \cdot R2 \cdot (V_{CC}-V_{th})/\{V_{th} \cdot (V_{th}+\alpha)\}$.

In the third determining example, a voltage of $V_{CC}$ is internally or externally applied to the node N1, while a voltage of 0V or $-\alpha$ is externally applied to the node N2.

In a fourth determining example, the threshold resistance value $R_{th1}$ is realized by applying $V_{CC}$ and 0V to the nodes N1 and N2, respectively, i.e., by applying a difference $V_{CC}$ in potential between the nodes N1 and N2. That is, $$V_{N3} = V_{CC} \cdot R2/(R1+R2) \tag{19}$$

In this case, in order to realize that the fuse F is disconnected, i.e., that $R1 > R_{th1}$, $$V_{N3} > V_{th} \tag{20}$$

Therefore, from the formulae (19) and (20), $$R1 > R_{th1} = R2 \cdot (V_{CC}-V_{th})/V_{th} \tag{21}$$

On the other hand, the threshold resistance value $R_{th2}$ is realized by applying $V_{CC}-\alpha$ and 0V to the nodes N1 and N2, respectively, i.e., by applying a difference $V_{CC}-\alpha$ in potential between the nodes N1 and N2. That is, $$V_{N3}=(V_{CC}-\alpha)\cdot R2/(R1+R2) \quad (22)$$

In this case, in order to realize that the fuse F is disconnected, i.e., that $R1>R_{th2}$, $$V_{N3}>V_{th} \quad (23)$$

Therefore, from the formulae (22) and (23), $$R1>R_{th2}=R2\cdot(V_{CC}-V_{th}-\alpha)/V_{th} \quad (24)$$

From the formulae (21) and (24), the threshold resistance value $V_{th1}$ is larger than the threshold resistance value $V_{th2}$ by $\alpha\cdot R2/V_{th}$.

In the fourth determining example, a voltage of $V_{CC}$ or $V_{CC}-\alpha$ is externally applied to the node N1, while a voltage of 0V is internally or externally applied to the node N2. Also in this case, since 0V is applied to the node N2, the pad P1 can serve as the node N2.

Figure 4:
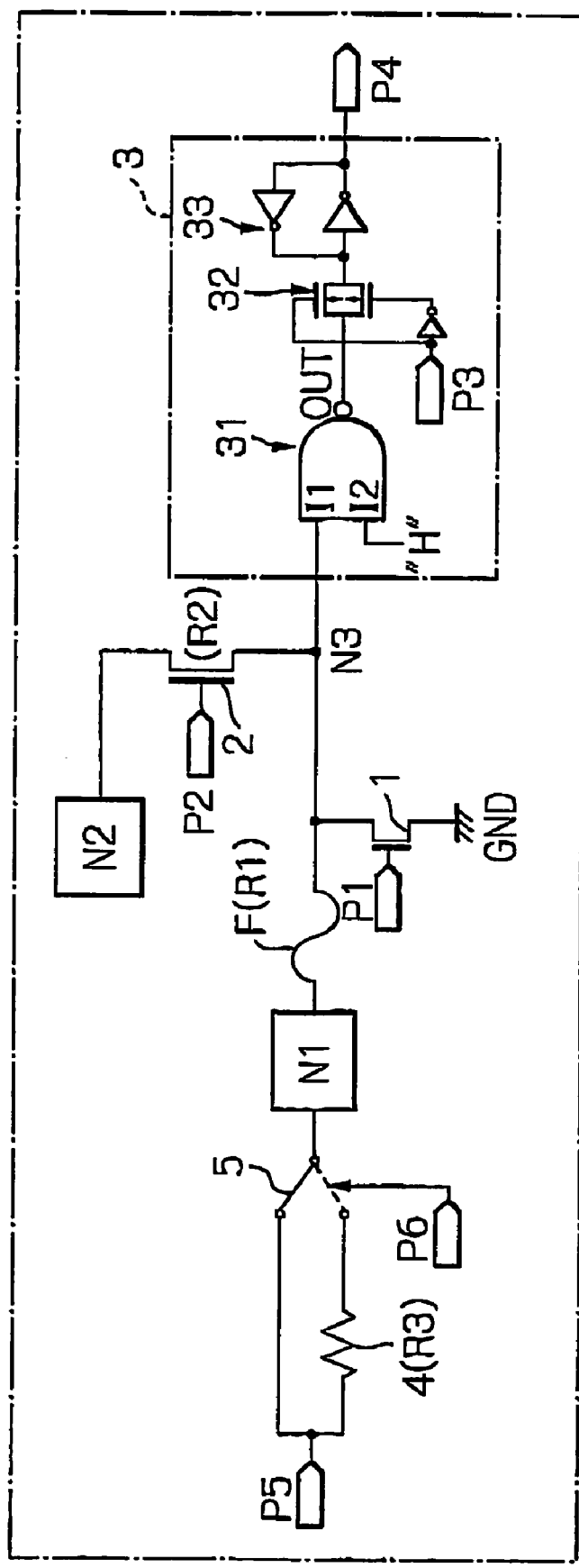
FIG. 4 is a circuit diagram of a second example of the semiconductor memory device used in FIGS. 1A, 1B, 1C and 1D.

In FIG. 4, which illustrates a second example of the semiconductor memory device used in FIGS. 1A, 1B, 1C and 1D, only one fuse section of a redundancy decoder thereof manufactured at step 101 of FIG. 1A is illustrated. That is, a pad P5, a resistor 4 having a resistance value R3, a switch 5, and a pad P6 for controlling the switch 5 are connected to the node N1 of FIG. 2. In this case, the resistor 4 can be constructed by a polycrystalline silicon wiring layer or a ON-state transistor. Thus, two resistance paths having different resistance values are provided between the pad P5 and the node N1.

Determination of two different threshold resistance values $R_{th1}$ and $R_{th2}$ are explained below. Even in this case, as shown in FIG. 3, the voltage at the pad P1 is low so that the transistor 1 is turned OFF. Also, while the voltage at the pad P2 is high from time t1 to time t4 to turn ON the transistor 2, the voltage at the pad P3 is made high from time t2 to time t3. Therefore, even after time t4, the comparison result of the comparator 3 is maintained at the pad P4.

The threshold resistance value $R_{th1}$ is realized by making the switch 5 directly select the pad P5 using the voltage at the pad P6, while applying 0V and $V_{CC}$ to the pad P5 and the node N2, respectively, so that a difference $V_{CC}$ in potential between the nodes N1 and N2.

On the other hand, the threshold resistance value $R_{th2}$ is realized by making the switch 5 select the resistor 4 using the voltage at the pad P6, while applying 0V and $V_{CC}$ to the pad P5 and the node N2, respectively, so that a difference $V_{CC}-V_{CC}\cdot(R1+R2)/(R1+R2+R3)$ in potential is applied between the nodes N1 and N2.

Thus, the operation of the device of FIG. 4 corresponds to the first determining example of the device of FIG. 2.

Figure 5:
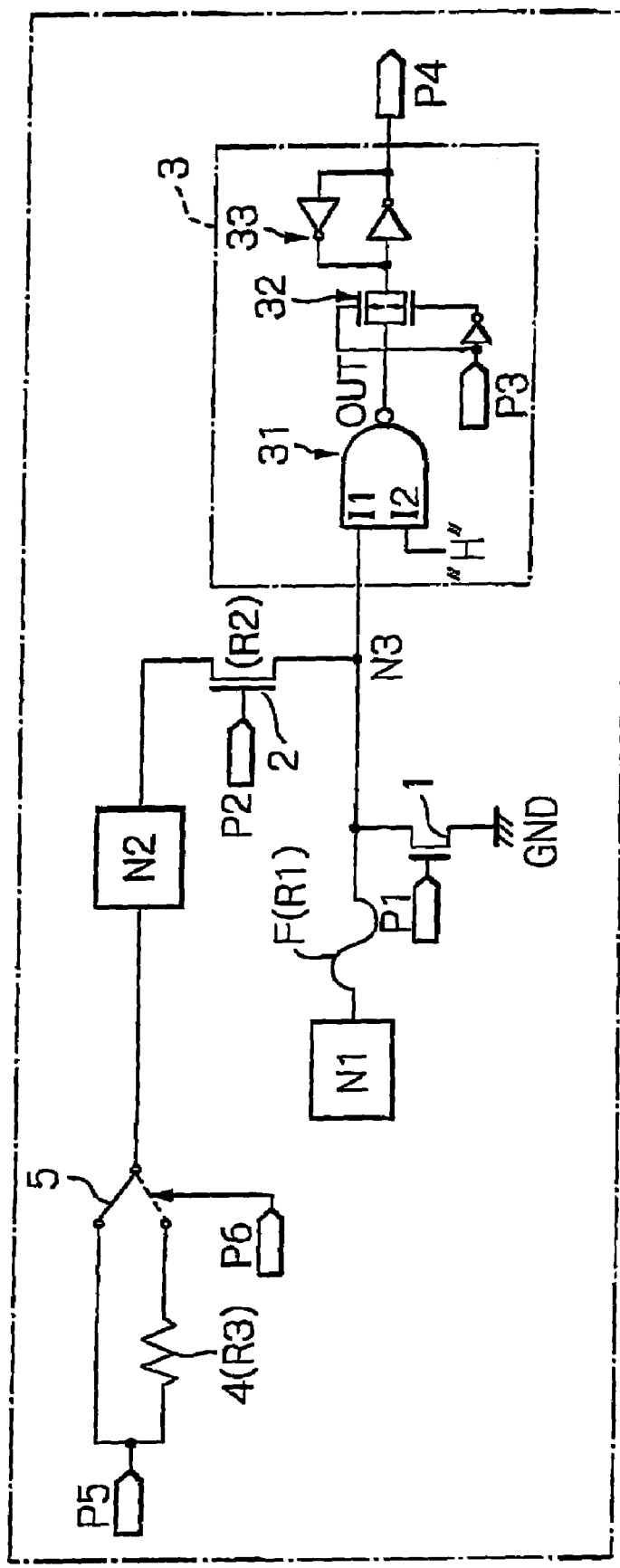

In FIG. 5, which illustrates a third example of the semiconductor memory device used in FIGS. 1A, 1B, 1C and 1D, only one fuse section of a redundancy decoder thereof manufactured at step 101 of FIG. 1A is illustrated. That is, the pad P5, the resistor 4 having the resistance value R3, the switch 5, and the pad P6 of FIG. 4 are connected to the node N2 thereof. Thus, two resistance paths having different resistance values are provided between the pad P5 and the node N2.

Determination of two different threshold resistance values $R_{th1}$ and $R_{th2}$ is explained below. Even in this case, as shown in FIG. 3, the voltage at the pad P1 is low so that the transistor 1 is turned OFF. Also, while the voltage at the pad P2 is high from time t1 to time t4 to turn ON the transistor 2, the voltage at the pad P3 is made high from time t2 to time t3. Therefore, even after time t4, the comparison result of the comparator 3 is maintained at the pad P4.

The threshold resistance value $R_{th1}$ is realized by making the switch 5 select the resistor 4 using the voltage at the pad P6, while applying 0V and $V_{CC}$ to the node N1 and pad P5, respectively, so that a difference $V_{CC}-V_{CC}\cdot(R1+R2)/(R1+R2+R3)$ in potential between the nodes N1 and N2.

On the other hand, the threshold resistance value $R_{th2}$ is realized by making the switch 5 directly select the pad P5 using the voltage at the pad P6, while applying 0V and $V_{CC}$ to the pad P5 and the node N2, respectively, so that a difference $V_{CC}$ in potential is applied between the nodes N1 and N2.

Thus, the operation of the device of FIG. 5 corresponds to the second determining example operation of the device of FIG. 2.

In FIG. 5, a voltage of 0V is internally or externally applied to the node N1.

Figure 6:
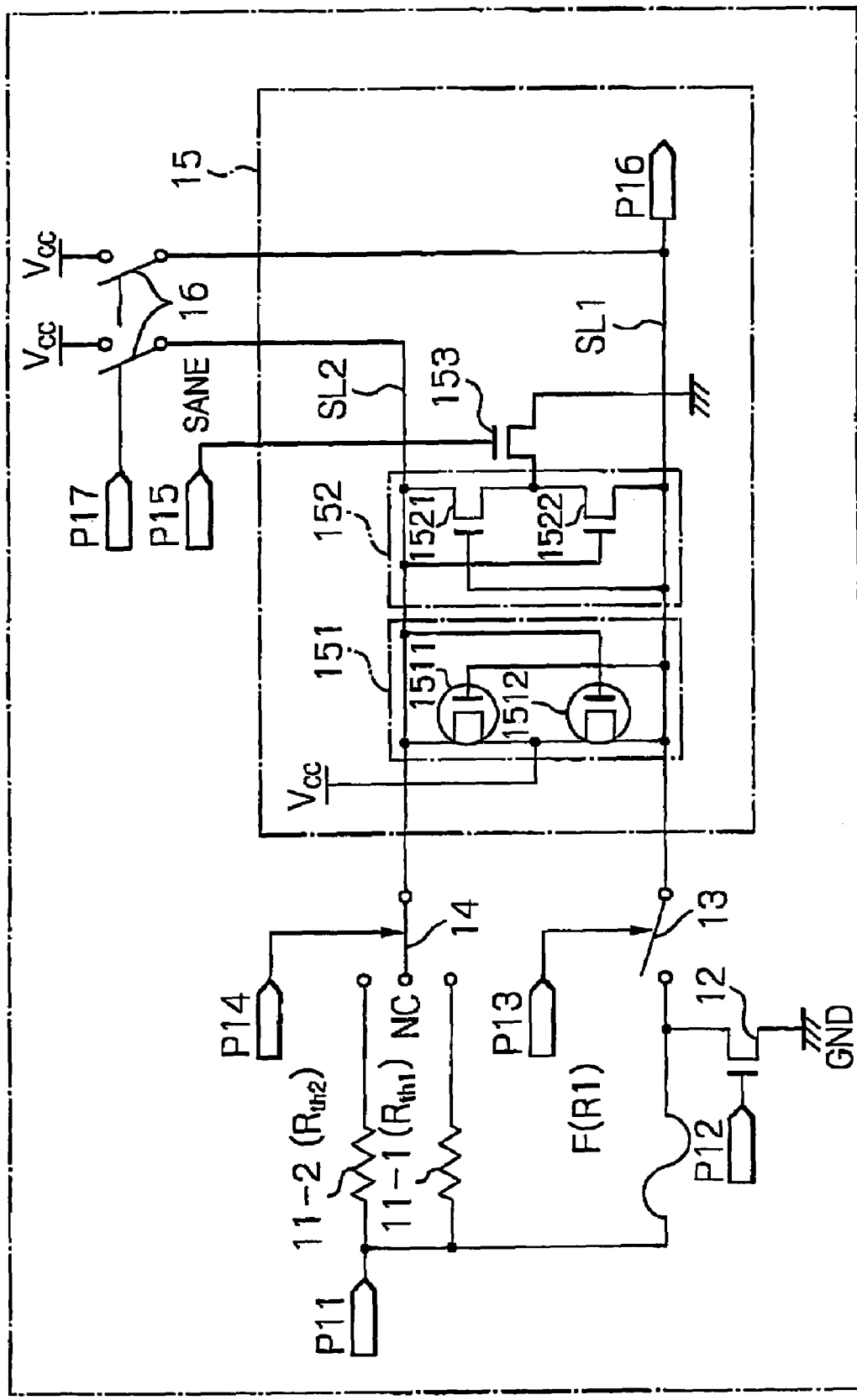
FIG. 6 is a circuit diagram of a third example of the semiconductor memory device used in FIGS. 1A, 1B, 1C and 1D.

In FIG. 6, which illustrates a third example of the semiconductor memory device used in FIGS. 1A, 1B, 1C and 1D, only one fuse section of a redundancy decoder thereof manufactured at step 101 of FIG. 1A is illustrated. That is, a pad P11 is connected to a fuse F, a resistor 11-1 having a threshold resistance value $R_{th1}$, and a resistor 11-2 having a threshold resistance value $R_{th2}$. The fuse F is connected via a switch 11 formed by an N-channel NOS transistor for blowing the fuse F to the ground GND. The transistor 11 is controlled by the voltage at a pad P12.

Also, the fuse F is connected to a switch 13 controlled by the voltage at a pad P13, while the resistors 11-1 and 11-2 are connected to a switch 14 controlled by the voltage at a pad P14. The switches 13 and 14 are connected to sense lines SL1 and SL2, respectively, of a sense amplifier 15 for comparing the resistance value R1 of the fuse F with the threshold resistance value $R_{th1}$ or $R_{th2}$ of the resistor 11-1 or 11-2.

The sense amplifier 15 is constructed by a positive-side sense amplifier section 151 formed by two cross-coupled P-channel MOS transistors 1511 and 1612, for sensing voltages at the sense lines SL1 and SL2, a negative-side sense amplifier 152 formed by two cross-coupled N-channel MOS transistors 1521 and 1522, for sensing the voltages at the sense lines SL1 and SL2, and an N-channel MOS transistor 153 for activating the negative-side sense amplifier section 152 in accordance with a sense amplifier enable signal SNE at a pad 15. Note that the positive-side sense amplifier section 151 is always activated.

Further, a pad P16 is connected to the sense line SL1 to generate a comparison result therefrom.

Additionally, switches 16 are connected to the sense lines SL1 and SL2 to precharge them at $V_{CC}$. The switches 16 are controlled by the voltage at a pad P17.

Determination of the two different threshold resistance values $R_{th1}$ and $R_{th2}$ are explained next.

Figure 7A:
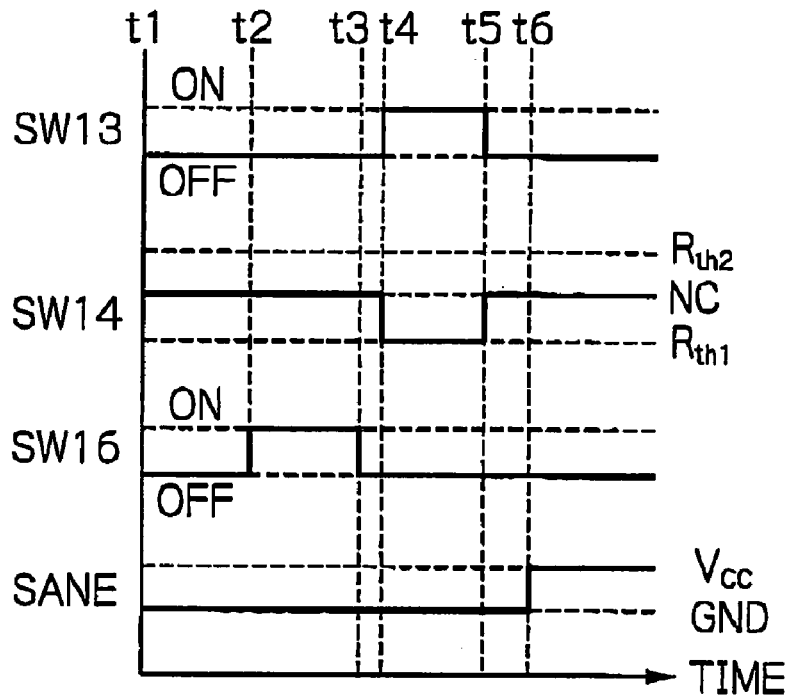
FIGS. 7A and 7B are timing diagrams explaining the operation of the device of FIG. 6.

The determination of the resistance value R1 of the fuse F against the threshold resistance value $R_{th1}$ will now be explained with reference to FIG. 7A. Note that the voltage at the pad P11 is initially grounded.

First, at time t1, the switches 13 and 16 are turned OFF and the switch 14 is located at a neutral point. Also, the negative-side sense amplifier section 152 is deactivated by the sense amplifier enable signal SANE. Therefore, only the positive-side sense amplifier section 151 is activated, so that one of the sense lines SL1 and SL2 are pulled up to $V_{CC}$.

Next, at time t2, the switch 16 is turned ON, so that the sense lines SL1 and SL2 are both changed to $V_{CC}$.

Next, at time t3, the switch 16 is turned OFF, so that the sense lines SL1 and SL2 are maintained at $V_{CC}$.

Next, at time t4, the switch 13 is turned ON, so that the sense line SL1 is connected to the fuse F. Simultaneously, the switch 14 is located at the resistor 11-1, so that the sense line SL2 is connected to the resistor 11-1. Therefore, currents are supplied to the fuse F and the resistor 11-1 in accordance with their resistance values R1 and $R_{th1}$. As a result, if $R1 > R_{th1}$, only the transistor 1511 is turned ON, so that the sense line SL1 is pulled up to $V_{CC}$, while the sense line SL2 is pulled down to GND. On the other hand, if $R1 \leq R_{th1}$, only the transistor 1512 is turned ON, so that the sense line SL2 is pulled up to $V_{CC}$, while the sense line SL1 is pulled down to GND.

Next, at time t5, the switch 13 is turned OFF and the switch 14 is located at the neutral point. As a result, only one of the transistors 1511 and 1512 is turned ON, so that only one of the sense lines SL1 and SL2 is pulled up to $V_{CC}$ in accordance with $R1 > R_{th1}$ or $R1 \leq R_{th1}$.

Finally, at time t6, the sense amplifier enable signal SANE is made high to turn ON the transistor 153, thus activating the negative-side sense amplifier section 152. As a result, only one of the transistors 1521 and 1522 is turned ON in accordance with $R1 > R_{th1}$ or $R1 \leq R_{th1}$, so that only one of the sense lines SL1 and SL2 is pulled down to GND.

Thus, if $R1 > R_{th1}$, the sense line SL1 is pulled up to $V_{CC}$, so that the voltage at the pad P16 is also pulled up to $V_{CC}$. On the other hand, if $R1 \leq R_{th1}$, the sense line SL1 is pulled down to GND, so that the voltage at the pad P16 is also pulled down to GND.

Figure 7B:
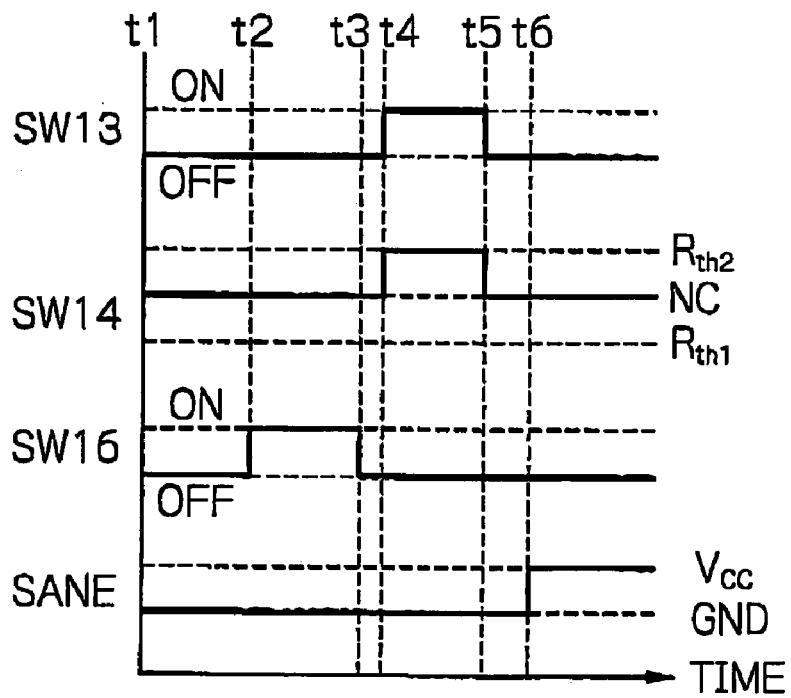

The determination of the resistance value R1 of the fuse F against the threshold resistance value $R_{th2}$ will be explained next with reference FIG. 7B. Note that, FIG. 7B is the same as FIG. 7A except that the switch 14 selects the resistor 11-2.

First, at time t1, the switches 13 and 16 are turned OFF and the switch 14 is located at a neutral point. Also, the negative-side sense amplifier section 152 is deactivated by the sense amplifier enable signal SANE. Therefore, only the positive-side sense amplifier section 151 is activated, so that one of the sense lines SL1 and SL2 are pulled up to $V_{CC}$.

Next, at time t2, the switch 16 is turned ON, so that the sense lines SL1 and SL2 are both changed to $V_{CC}$.

Next, at time t3, the switch 16 is turned OFF, so that the sense lines SL1 and SL2 are maintained at $V_{CC}$.

Next, at time t4, the switch 13 is turned ON, so that the sense line SL1 is connected to the fuse F. Simultaneously, the switch 14 is located at the resistor 11-2, so that the sense line SL2 is connected to the resistor 11-2. Therefore, currents are supplied to the fuse F and the resistor 11-2 in accordance with their resistance values R1 and $R_{th2}$. As a result, if $R1 > R_{th2}$, only the transistor 1511 is turned ON, so that the sense line SL1 is pulled up to $V_{CC}$, while the sense line SL2 is pulled down to GND. On the other hand, if $R1 \leq R_{th2}$, only the transistor 1512 is turned ON, so that the sense line SL2 is pulled up to $V_{CC}$ while the sense line SL1 is pulled down to GND.

Next, at time t5, the switch 13 is turned OFF and the switch 14 is located at the neutral point. As a result, only one of the transistors 1511 and 1512 is turned ON, so that only one of the sense lines SL1 and SL2 is pulled up to $V_{CC}$ in accordance with $R1 > R_{th2}$ or $R1 \leq R_{th2}$.

Finally, at time t6, the sense amplifier enable signal SANE is made high to turn ON the transistor 153, thus activating the negative-side sense amplifier section 152. As a result, only one of the transistors 1521 and 1522 is turned ON in accordance with $R1 > R_{th1}$ or $R1 \leq R_{th1}$, so that only one of the sense lines SL1 and SL2 is pulled down to GND.

Thus, if $R1 > R_{th2}$, the sense line SL1 is pulled up to $V_{CC}$, so that the voltage at the pad P16 is also pulled up to $V_{CC}$. On the other hand, if $R1 \leq R_{th2}$, the sense line SL1 is pulled down to GND, so that the voltage at the pad P16 is also pulled down to GND.

In FIGS. 2, 4, 5 and 6, only two threshold resistance values $R_{th1}$ and $R_{th2}$ are provided. However, three or more threshold resistance values can be provided. That is, in FIG. 2, different values α1, α2, . . . are given to the device. In FIGS. 4 and 5, two or more resistors 4 having different resistance values can be connected in parallel, and one of them can be selected by the switch 5. In FIG. 6, three or more resistors 11-1, 11-2, 11-3, . . . can be provided, and one of them can be selected by the switch 14.

Also, in FIGS. 2, 4, 5 and 6, the fuse F is melted by supplying a blowing current thereto, so that the fuse F can be disconnected by the electromigration phenomenon.

Further, the present invention can be applied to other semiconductor devices than a semiconductor memory device.

As explained hereinabove, according to the present invention, since a plurality of test operations are carried out by using different threshold resistance values, the erroneous determination can be suppressed.

The invention claimed is:

1. A method for testing whether or not a fuse on a semiconductor substrate is disconnected, comprising:
   performing a first test operation upon said fuse by determining whether or not a resistance value of said fuse is larger than a first threshold resistance value; and
   performing a second test operation upon said fuse by determining whether or not a resistance value of said fuse is larger than a second threshold resistance value smaller than said first threshold resistance value, after said first test operation is performed,
   wherein said fuse is connected in series to a resistive element formed on said semiconductor substrate,
   said first test operation performing comprising applying a first difference in potential between a series of said fuse and said resistive element; and
   said second test operation performing comprising applying a second difference in potential between a series of said fuse and said resistive element, said second difference in potential being different from said first difference in potential.

2. The method as set forth in claim 1, wherein said first test operation performing further comprises comparing a voltage at a node between said fuse and said resistive element with a threshold voltage while said first difference in potential is being applied; and
   said second test operation performing further comprising comparing the voltage at the node between said fuse and said resistive element with said threshold voltage while said second difference in potential is being applied.

3. The method as set forth in claim 1, wherein at least one of said first and second differences in potential is supplied from the outside of said semiconductor substrate.

4. The method as set forth in claim 1, wherein at least one of said first and second differences in potential is generated within said semiconductor substrate.

5. The method as set forth in claim 1, wherein said first and second differences in potential are realized by selectively applying the ground voltage and a negative voltage to one node of the series of said fuse and said resistive element.

6. The method as set forth in claim 1, wherein said first and second differences in potential are realized by selectively applying a positive power supply voltage and a positive voltage lower than said positive power supply voltage to one node of the series of said fuse and said resistive element.

7. The method as set forth in claim 1, wherein one node of the series of said fuse and said resistive element comprises a pad for supplying a blowing current to said fuse.

8. The method as set forth in claim 1, wherein one node of the series of said fuse and said resistive element is connected via a plurality of resistance paths having different resistance values to a pad,
    said first difference-in-potential applying comprising applying a third difference in potential between said pad and the other node of said fuse and said resistive element via one of said resistance paths,
    said second difference-in-potential applying comprising applying said third difference in potential between said pad and the other node of said fuse and said resistive element via another of said resistance paths.

9. The method as set forth in claim 8, wherein said pad is used for blowing said fuse.

10. The method as set forth in claim 1, wherein said fuse is disconnected by supplying a blowing current thereto.

11. The method as set forth in claim 1, wherein said fuse is disconnected by an electromigration phenomenon.

12. The method as set forth in claim 1, wherein said resistive element comprises a transistor.

13. The method as set forth in claim 1, wherein said first test operation performing comprises comparing a current flowing through said fuse with a current flowing through a first resistor having said first threshold resistance value,
    said second test operation performing comprising comparing a current flowing through said fuse with a current flowing through a second resistor having said second threshold resistance value.

14. A semiconductor device, comprising:
    first and second nodes;
    a fuse and a resistive element connected in series between said first and second nodes;
    a comparator connected to a third node between said fuse and said resistive element and adapted to compare a voltage at said third node with a threshold voltage, so that different differences in potential are applied between said first and second nodes to determine whether or not said fuse is disconnected;
    a pad; and
    a plurality of resistance paths having different resistance values connected to said pad and one of said first and second nodes, so that a difference in potential is applied between said pad and the other of said first and second nodes.

15. The semiconductor device as set forth in claim 14, wherein said comparator comprises a logic circuit.

16. The semiconductor device as set forth in claim 15, wherein said logic circuit comprises a NAND circuit.

17. A semiconductor device, comprising:
    a pad;
    first and second sense lines;
    a fuse connected to said pad;
    a first switch connected between said fuse and said first sense line;
    a plurality of resistors having different threshold resistance values connected to said pad;
    a second switch connected between said resistors and said second sense line and adapted to select one of said resistors;
    a sense amplifier connected to said first and second sense lines and adapted to compare a current flowing through said fuse connected to said first sense line by said first switch with a current flowing through one of said resistors selected by said second switch;
    a positive-side sense amplifier section connected to said first and second sense lines;
    a negative-side sense amplifier section connected to said first and second sense lines; and
    an enable element connected to said negative-side sense amplifier section and adapted to enable said negative-side sense amplifier section, said device further comprising a switch circuit connected to said first and second sense lines and adapted to apply a power supply voltage thereto.

* * * * *